United States Patent [19]

Lee et al.

[11] Patent Number: 5,525,192

[45] Date of Patent: Jun. 11, 1996

[54] METHOD FOR FORMING A SUBMICRON RESIST PATTERN

[75] Inventors: Jun S. Lee, Seoul; Keom J. Park, Incheon-si, both of Rep. of Korea

[73] Assignee: LG Semicon Co., Ltd., Seoul, Rep. of Korea

[21] Appl. No.: 200,769

[22] Filed: Feb. 23, 1994

[30] Foreign Application Priority Data

Jan. 14, 1994 [KR]  Rep. of Korea ............... 623/1994

[51] Int. Cl.⁶ ........................... G03F 7/38; G03F 7/30
[52] U.S. Cl. ........................... 156/651.1; 156/655.1; 156/659.11; 430/313; 430/314; 430/315; 430/316; 430/317; 430/323; 430/324; 430/327
[58] Field of Search ................... 156/651, 655, 156/659.1, 668, 904, 651.1, 655.1, 659.11; 430/313, 314, 315, 317, 323, 324, 316, 327

[56] References Cited

U.S. PATENT DOCUMENTS

| | | | |
|---|---|---|---|
| 4,452,881 | 6/1984 | Augstein et al. | 430/327 |
| 4,803,181 | 2/1989 | Buchmann et al. | 437/228 |
| 4,882,008 | 11/1989 | Garza et al. | 156/643 |
| 4,978,594 | 12/1990 | Bruce et al. | 430/323 |
| 5,094,936 | 3/1992 | Misium et al. | 430/325 |
| 5,262,282 | 11/1993 | Hieda et al. | 430/325 |
| 5,322,764 | 6/1994 | Kamiyama et al. | 430/325 |

FOREIGN PATENT DOCUMENTS

| | | | |
|---|---|---|---|
| 0314185 | 5/1989 | European Pat. Off. | 430/327 |
| 0599539 | 6/1994 | European Pat. Off. | 430/323 |
| 4124667 | 4/1992 | Japan | 430/313 |

*Primary Examiner*—Lee C. Wright
*Attorney, Agent, or Firm*—Morgan, Lewis and Bockius

[57] ABSTRACT

This invention relates to a method for forming a submicron pattern of a resist using a silylation process which can improve resolution and a side wall profile of the resist. The method comprises the steps for coating a photo resist film on a silicon substrate, forming a primary insoluble layer by a surface treatment of the coated resist film with alkali solution, forming a latent image pattern on an exposed part of the resist film by exposing the resist film using a mask for exposure, forming a surface step with the non-exposed resist film by carrying out a selective etching of the exposed resist film to a certain thickness, forming a silylation layer on the surface of the exposed and etched resist film by carrying out a silylation process, removing the non-exposed resist film by etching, and forming a resist pattern by removing the silylation layer.

16 Claims, 14 Drawing Sheets

FIG .10

METHOD FOR FORMING A SUBMICRON RESIST PATTERN

FIELD OF THE INVENTION

This invention relates to a photo lithography process, more particularly to a method for forming a submicron pattern of a resist using a silylation process which can improve resolution and a side wall profile of the resist.

BACKGROUND OF THE INVENTION

Advances in integration technology of semiconductor elements have required a high precision process in every production process of semiconductor elements.

Particularly in memory elements for the generations after 64M DRAM, it can be foreseen that a micro-lithography will become a important parameter, and steps on forming solid charge, limits of uniformity in exposure and uniform coating of resist are the tasks which have to be solved in production of stepped resist.

Until now, a technology of chemical treatment of resist has been being developed for the improvement of resolution, of which the silylation process is a representing example.

This silylation process is a process which permits a dry etching of resist by processing resist to have resistance against O2 reactive ion etching.

Though, in initial stage, a process which treats to have resistance against O2 reactive ion etching using polymer containing silicon had been developed, an epoch-making improvement on the resistance against O2 reactive ion etching could be attained on the disclosure of "DESIRE(Diffusion Enhanced silylated Resist)PROCESS" on 37 Advances in Resist Technology and processing, SPIE Proceedings Vol. 631, 1986" by F. Coopmans and B. Roland on 1986, which permits to obtain a sharp pattern of 0.5 m even in stepped condition.

This process is a process to improve resistance in dry O2 development by silylation of only exposure portion with surface treatment of silicon after a resist exposure.

Thereafter, the resolution has been being improved more through changing of exposure method from g-line to j-line.

Method for forming a resist pattern using silylation process is described in detail in U.S. Pat. Nos. 4,882,008, 5,094,936, 4,810,601 and 4,803,181. Though the resolution has been improved due to this silylation process, contrary to this, many problems have been raised. Especially, exact critical dimension ratio of a resist pattern could not have been obtained.

FIGS. 1(A) to 1(D) show conventional process for forming submicron pattern of a stepped resist using film of a silylation layer.

Figure 1A:
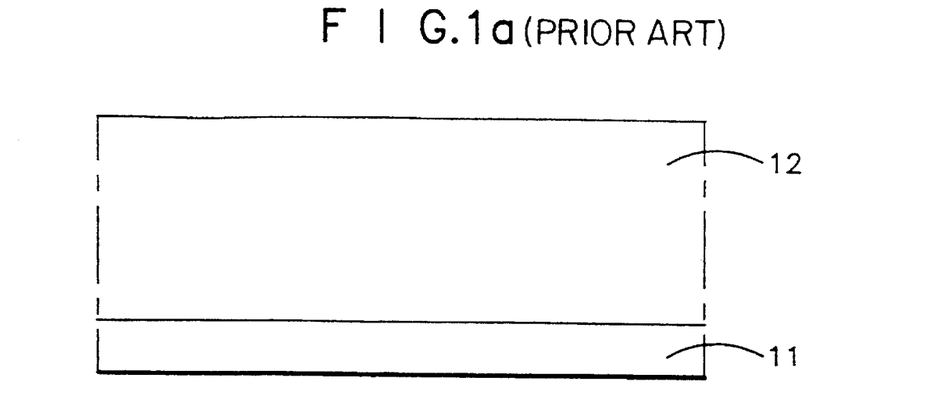
FIGS. 1(A) to 1(E) show a conventional process for forming a submicron resist pattern using a thin film silylated layer.

Referring to FIGS. 1, a positive inorganic resist film 12 is deposited on the surface of a silicon substrate or lower semiconductor layer 11 (FIG. 1(A)).

Figure 1B:
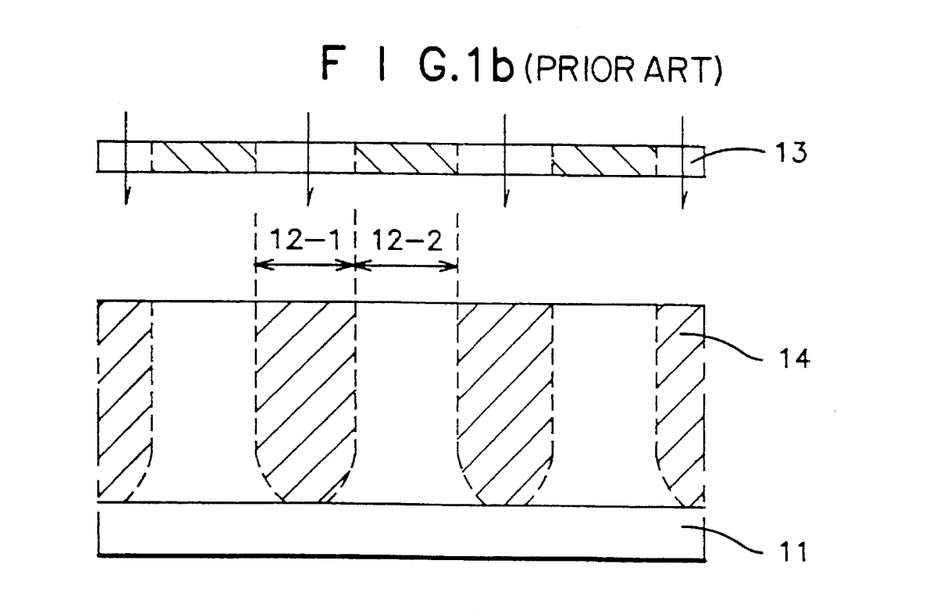

Then, on exposure of the positive inorganic resist film 12 to light using an exposure mask 13, the positive inorganic resist film 12 is divided into exposed parts 12-1 and non-exposed parts 12-1, and a latent image pattern 14 is formed on an exposed resist film 12-1 (FIG. 1(B)).

Figure 1C:
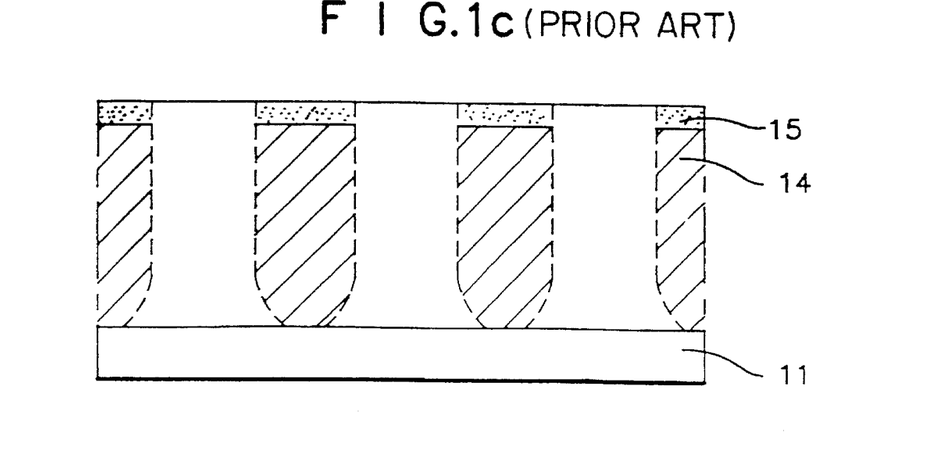

On carrying out of a silylation process with HMDS(Hexamethyldisilazane) silylation agent, the surface of the exposed resist film 12-1 is silylated (FIG. 1(C)).

That is, when heated in HMDS atmosphere, the HMDS, diffused into the surface of the exposed resist film 12-1, displaces OH radical of novolic resin to form a silylated layer 15 on the surface of the exposed resist film 12-1. Following show the reaction formula on a silylation process.

The silylated layer 15, a silicon containing layer processed on the exposed silicon resist film 12-1, serves as a mask in O2 dry etching.

Figure 1D:
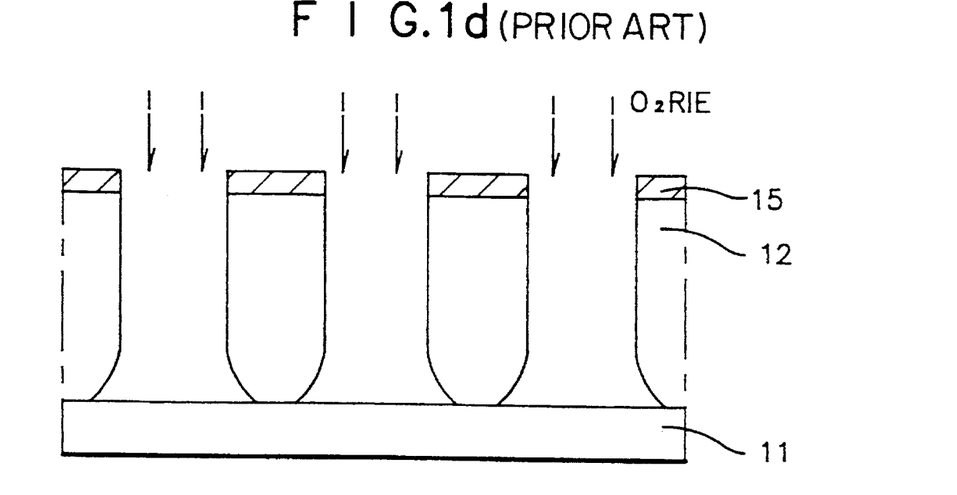

The non-exposed photo resist film 12-2 is selectively removed by dry etching of an O2 plasma etching method (FIG. 1(D)).

In this time, the silylated layer 15 serves as an etching mask because the resistance against oxygen has been increased through a conversion into an oxide film on the O2 reactive ion etching.

Figure 1E:
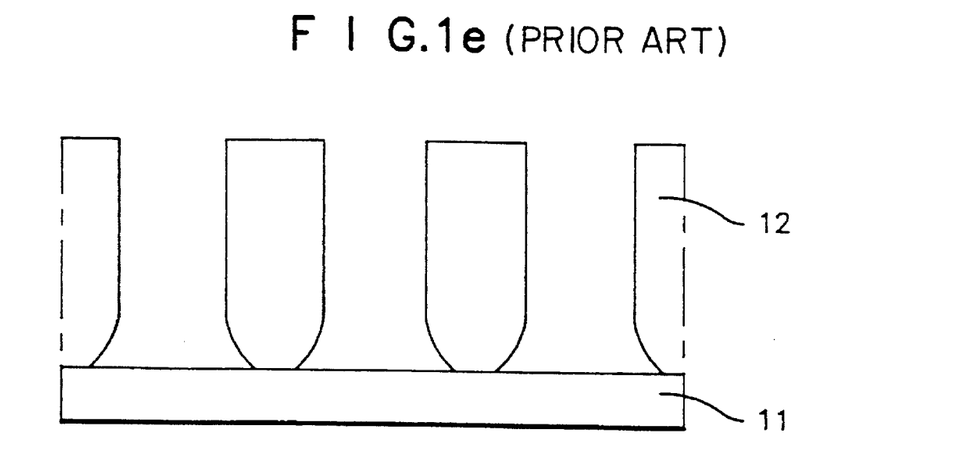

Finally, a submicron resist pattern 12 is obtained by removing the remained silylated layer 15.

As shown in FIGS. 1, in case forming a resist pattern using silylation process, the vertical profile of the resist pattern is poor because the resist pattern does not have a steep slope.

Also, when the thickness of the silylated layer 15 serving as an etching mask layer on the dry etching is thin, a resist pattern having narrower critical dimension than desired is obtained.

Therefore, it is not possible to carry out precise patterning on a metal film or a semiconductor layer, when a patterning on a metal film or a semiconductor layer (not shown) is carried out in a following etching process using such a resist pattern as a mask.

FIGS. 2 show a conventional process for forming a submicron pattern of a stepped resist film using a thick silylated layer.

The same numbers are given in FIGS. 2 to the same materials with FIGS. 1.

The process for forming a submicron resist pattern shown in FIGS. 2 is the same with the process shown in FIGS. 1, except the thick silylated layer 15' in FIGS. 2 formed thereon.

Likewise, the vertical profile of the resist pattern in FIGS. 2 is also poor.

Further, due to the thick silylated layer 15' serving as an etching mask layer in an etching, the critical dimension of the submicron resist pattern is formed wider than desired, with which resist pattern as a mask, a precise patterning of a lower layer can not be carried out in a following process.

Figure 2A:
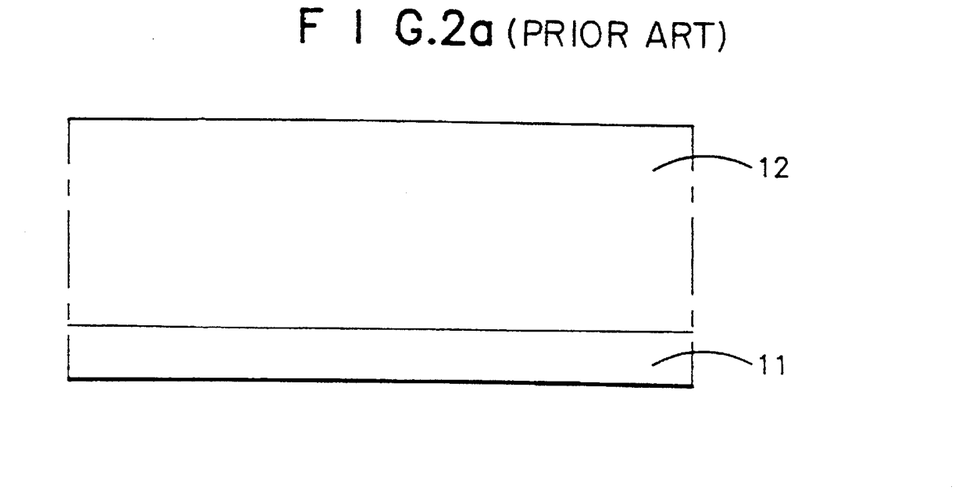
FIGS. 2(A) to 2(E) show a conventional process for forming a submicron resist pattern using a thick film silylated layer.
Figure 2B:
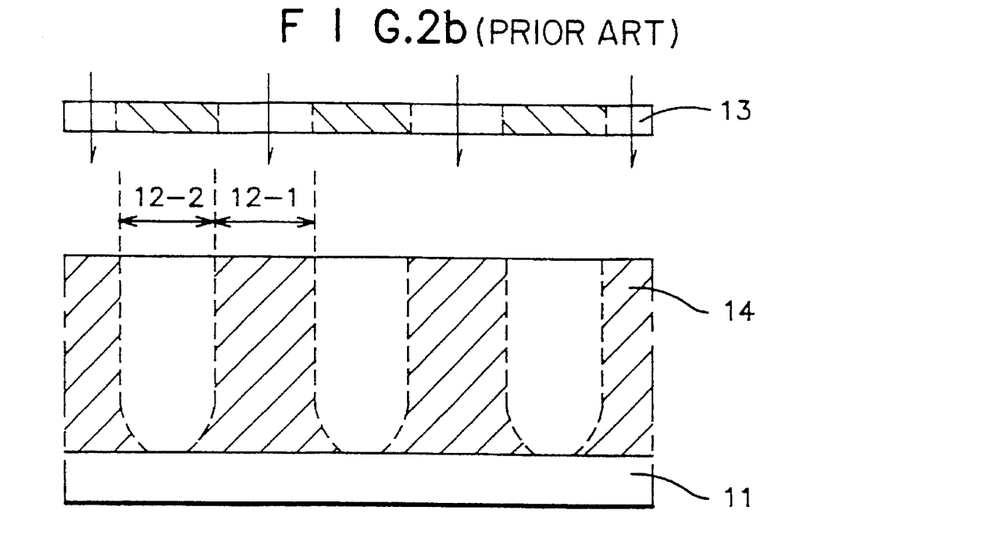
Figure 2C:
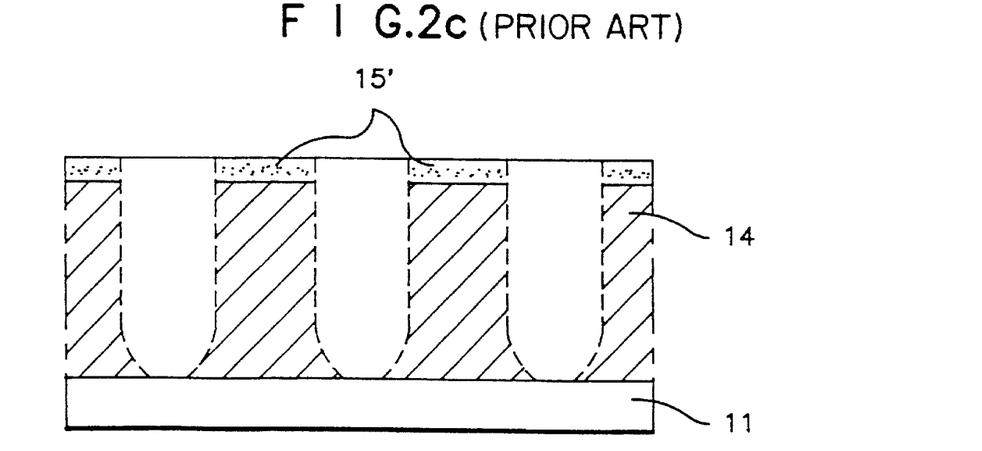
Figure 2D:
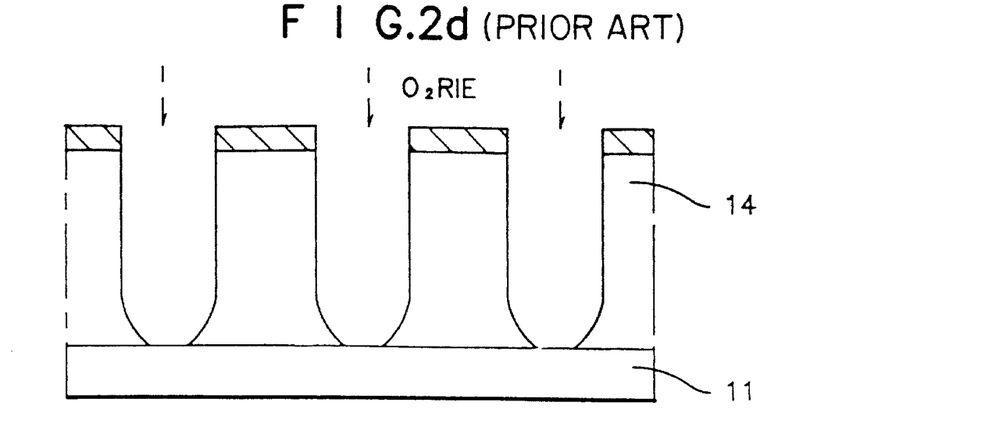
Figure 2E:
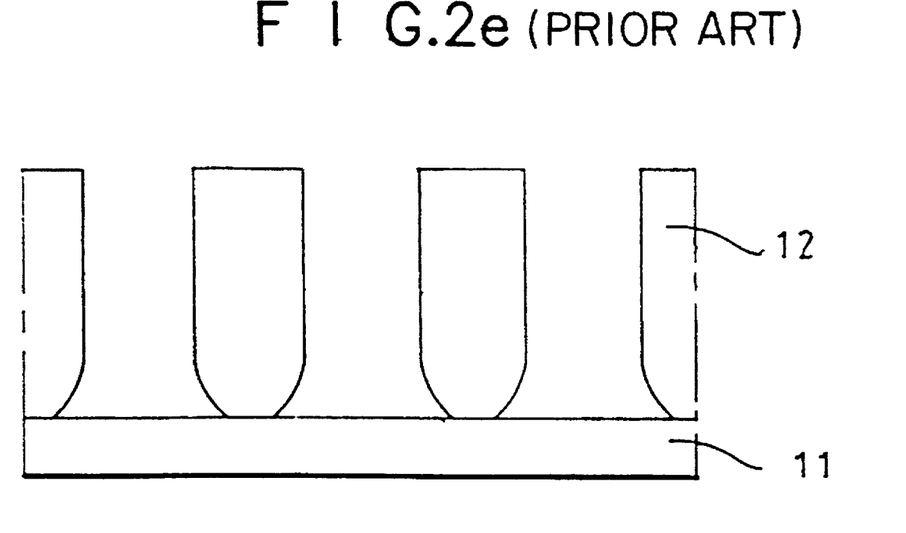
Figure 3:
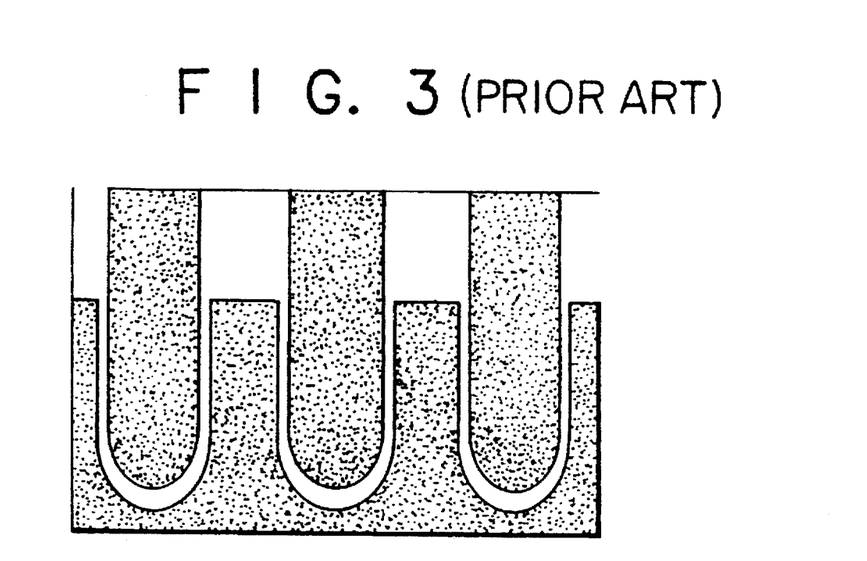
FIG. 3 is an SEM (Scanning Electron Microscope) photograph of the resist pattern shown in FIG. 2(E).

FIG. 3 is a SEM (Scanning Electron Microscope) photography of the submicron resist pattern 12 shown in FIG. 2(E).

Recently, a method for improving the resolution by treating the surface of the stepped resist film with alkali is suggested, such as HARD method published on "Digest of papers Micro Process Conf. 164 by M. Endow et al. in Japan on 1988 and PRISM method published on J. Voc. Sci. Technol., B6(6), 1988, pp 2249, by Yoshimura et al.. A method for forming a submicron resist pattern using an alkali surface treatment is a method including depositing a resist film, forming an insoluble layer on the surface of the resist film by treating the surface of the deposited resist film with alkali, and forming a submicron resist pattern by carrying out exposure and gradual development process, which expands a range of focus depth that improves the resolution.

FIGS. 4(A) to 4(E) show a conventional process for forming a submicron resist pattern using alkali surface treatment.

Figure 4A:
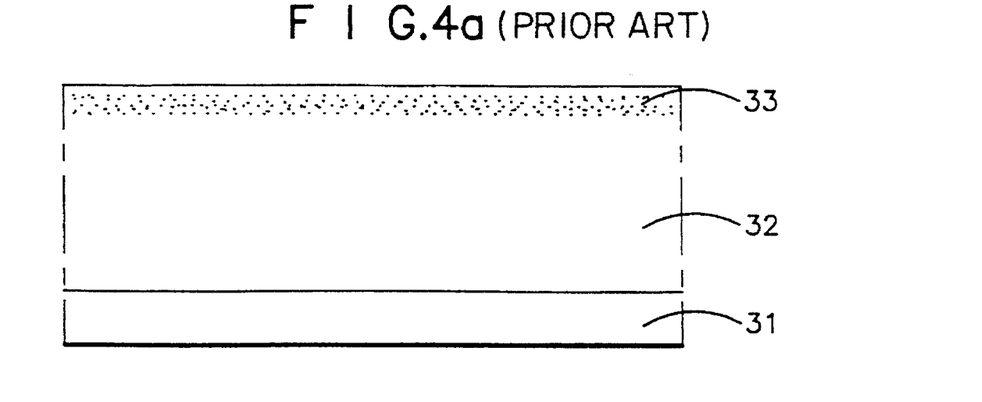
FIGS. 4(A) to 4(E) show a conventional process for forming a submicron resist pattern using an alkali surface treatment.

First, PFI-15(25cp) resist is coated on a lower semiconductor layer or a silicon substrate 31 to a thickness of about 1.0 μm to form a resist film 32, which is soft baked at a temperature of 110 degrees C. for 90 seconds.

Then, the surface of the coated resist film 32 is alkali treated in Tok NMD-W raw solution for a predetermined period of time to form a primary insoluble layer 33. (FIG. 4(A)).

The resist film 32 having an insoluble layer 33 is exposed using Hitachi LD5011: A stepper. (FIG. 4(B)).

Figure 4B:
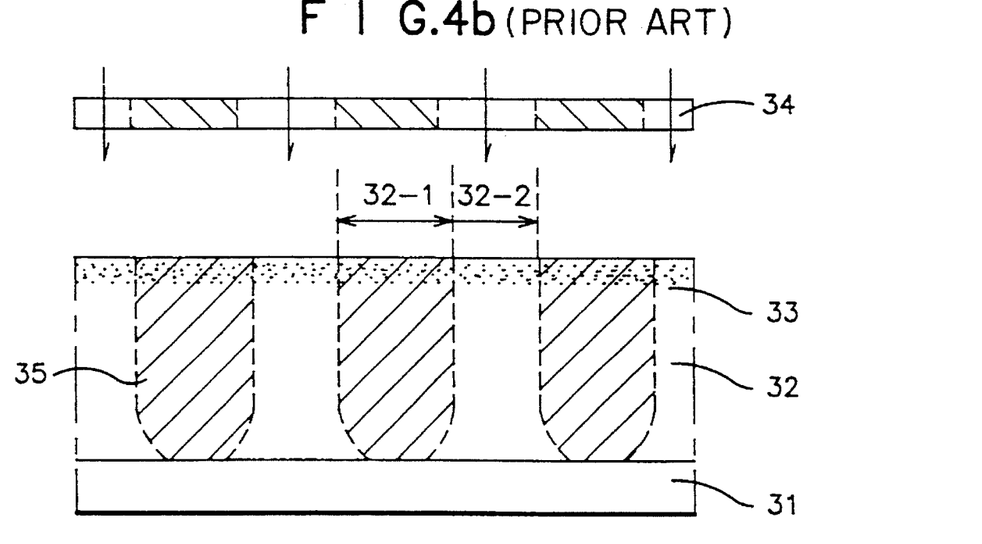

A latent image pattern 35 is formed on the exposed resist film 32-2.

Figure 4C:
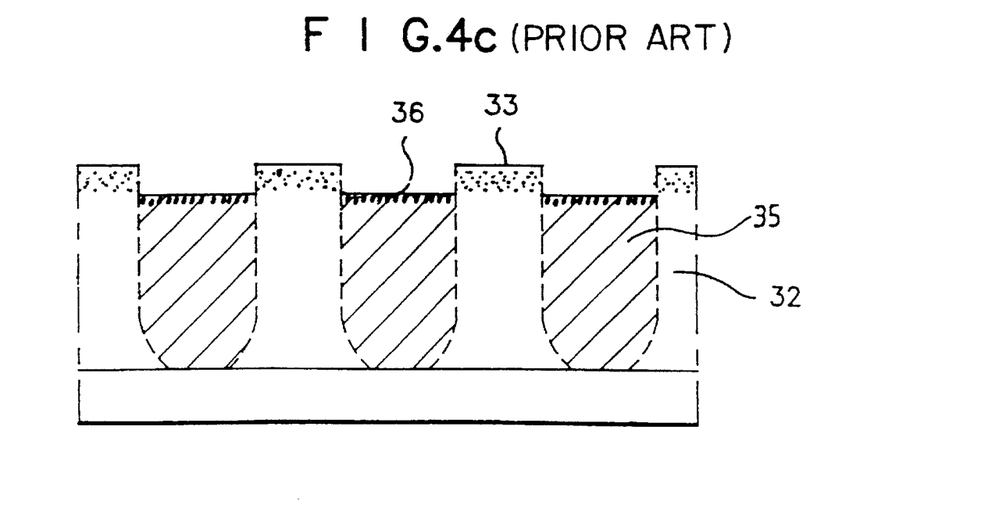

The resist film 32 after exposition is baked at 110 degrees C. for 90 seconds, and developed with puddle-type NMW-D to form a secondary insoluble layer 36.

The resist film 32 is developed as much as the depth of the primary insoluble layer 33 on development. (FIG. 4(C)).

Figure 4D:
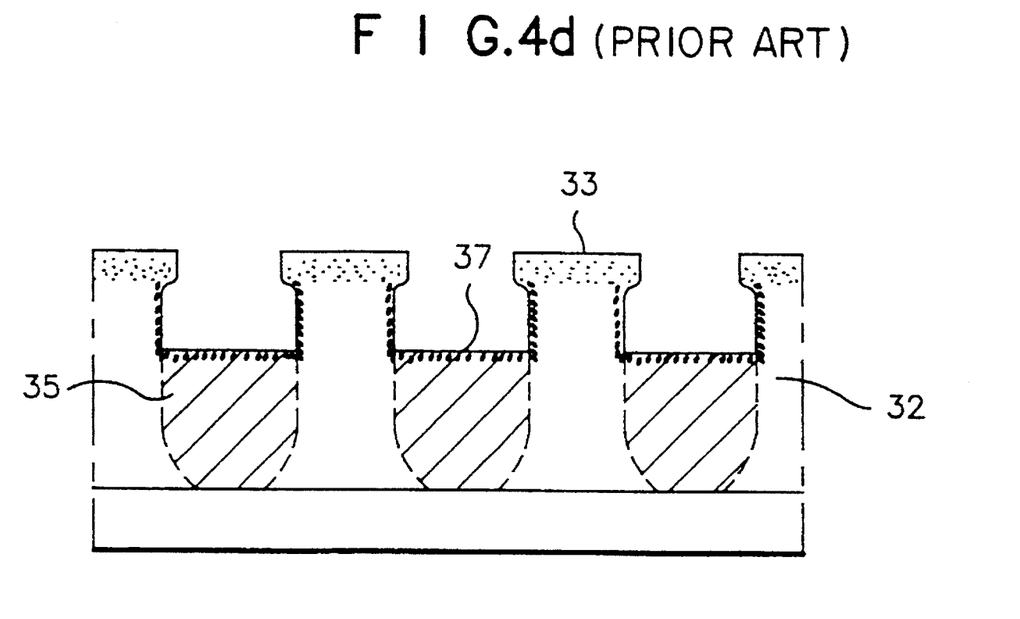
Figure 4E:
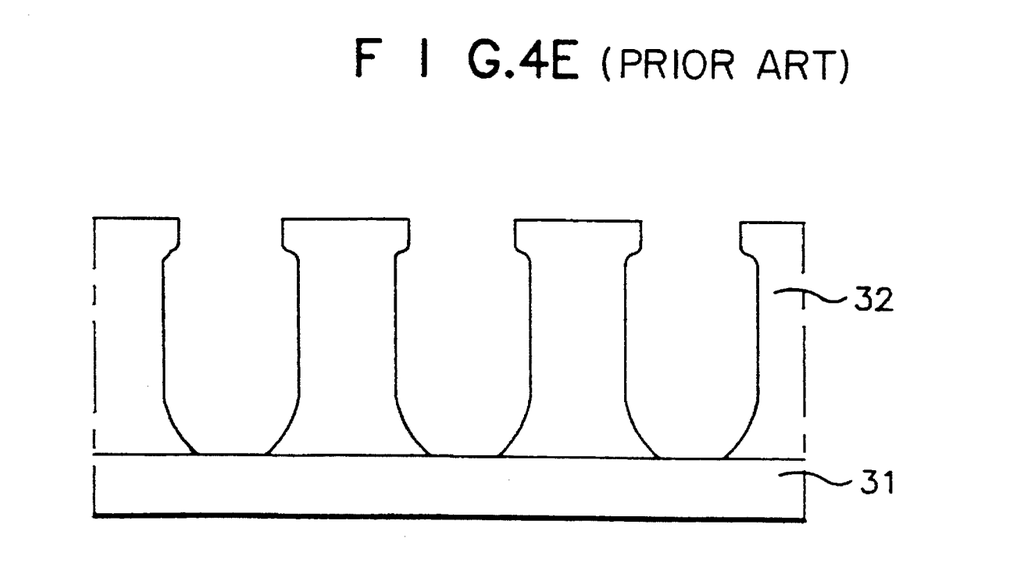
Figure 5A:
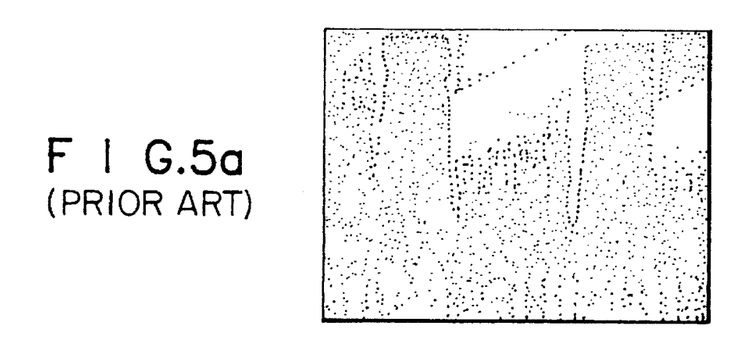
FIGS. 5(A) to 5(D) are Scanning Electron Microscope photographs of the profile of a resist pattern each taken at intervals of the lapse time of an alkali surface treatment on forming a submicron resist pattern shown in FIGS. 4.
Figure 5B:
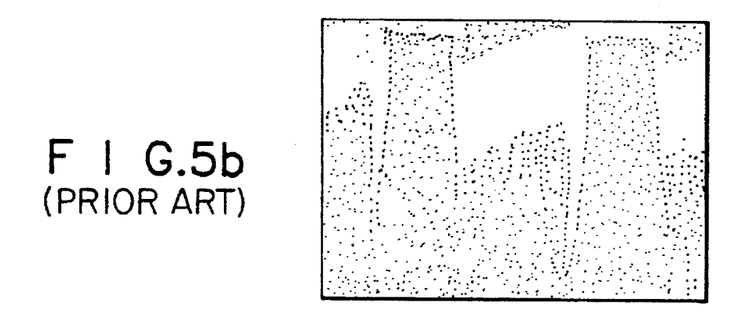
Figure 5C:
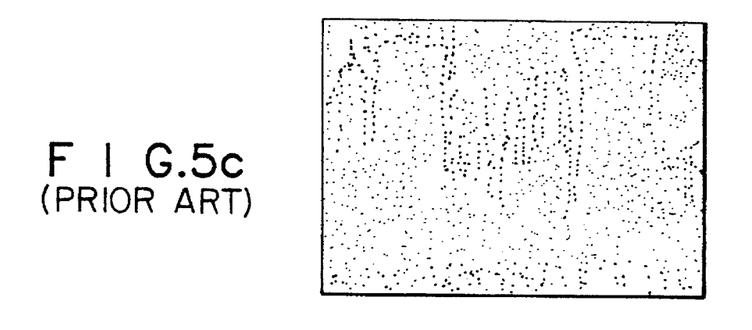
Figure 5D:
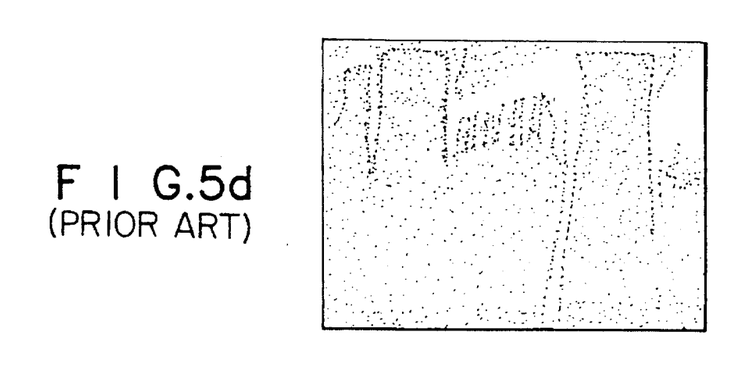

Then, by carrying out gradual development continuously until the depth of the development is deeper than the depth of the primary insoluble layer 33, a tertiary insoluble layer 37 is formed (FIG. 4(D)), and finally, a submicron resist pattern 32' is formed by developing until the substrate is exposed.

On carrying out a gradual development continuously until the depth of the development is deeper than the depth of the primary insoluble layer 33, an over-hang emerges from the upper part of the resist pattern 32.

FIGS. 5 are SEM photographs of the pattern profiles taken at intervals of the lapse time of the alkali surface treatment in forming a submicron resist pattern using an alkali treatment shown in FIGS. 4, wherein it can be observed that the overhang becomes greater as the lapse time of the surface treatment becomes longer.

Therefore, when forming a submicron resist pattern using an alkali surface treatment, though a resist pattern of desired critical dimension can be obtained, there is a limit in an improvement of the resolution, because of the development of overhang which causes narrower focus depth and a defective resist profile.

Figure 6A:
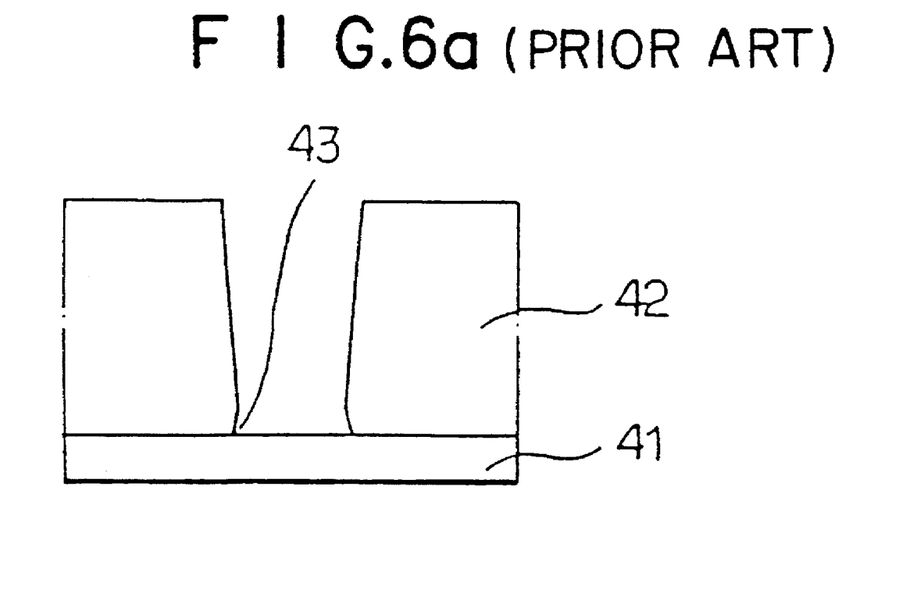
FIG. 6(A) is a section of a conventional resist pattern on forming a contact hole.
Figure 6B:
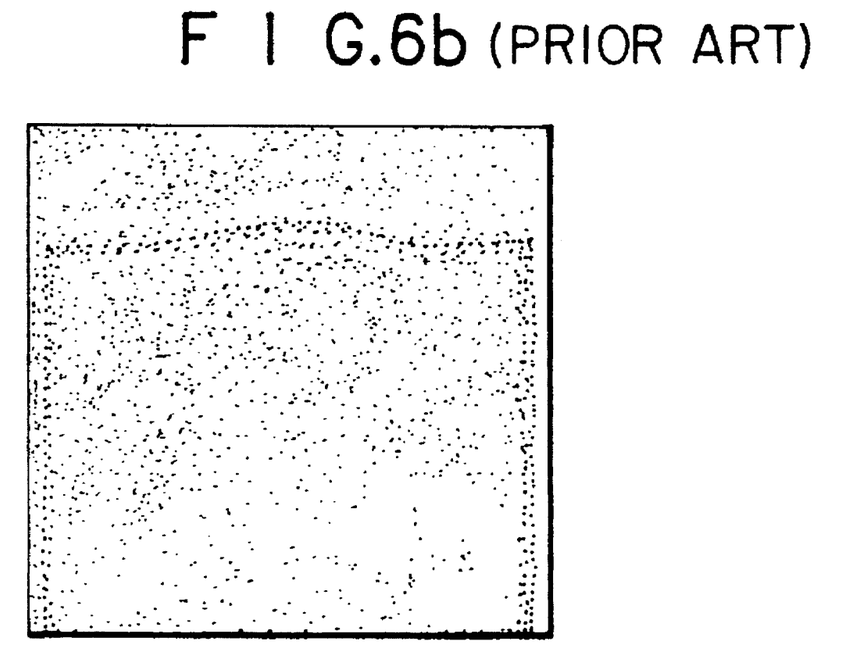
FIG. 6(B) is an SEM photograph of FIG. 6(A).

FIG. 6(A) is a sectional drawing of a conventional resist pattern in forming a contact hole, and FIG. 6(B) is an SEM photograph of FIG. 6(A).

Another problem developed in forming a pattern of a stepped resist film is a development of micro-grooves in the lower part of a resist pattern 42' in forming a contact hole depending on the conditions of the resist, exposure, baking and development.

SUMMARY OF THE INVENTION

This invention is for solving aforementioned prior art problems, the object of this invention is to provide a method for forming an improved submicron resist pattern which can solve problems of a variation of critical dimension and overhang by employing a silylation process and an alkali surface treatment process in parallel.

These and other object and the features of this invention can be achieved by providing a method for forming a submicron resist pattern including steps for coating a photo resist film on a silicon substrate, forming a primary insoluble layer by a surface treatment of the coated resist film with alkali solution, forming a latent image pattern on an exposed part of the resist film by exposing the resist film using a mask for exposure, forming a surface step of the non-exposed resist film by carrying out a selective etching of the exposed resist film as much as the thickness of the primary insoluble layer, forming a silylation layer on the surface of the exposed and etched resist film by carrying out a silylation process, removing the non-exposed resist film with O2 reactive ion etching method using the silylation layer as a mask, and forming a resist pattern by removing the silylation layer.

DETAILED DESCRIPTION OF THE INVENTION

The detail of this invention is to be described hereinafter, referring to attached drawings.

FIGS. 7(A) to 7(F) show a process for forming a submicron resist pattern in accordance with a first embodiment of this invention.

As shown in FIGS. 7, a primary insoluble layer 63 is formed by coating a single layer positive organic resist film 62 on a silicon substrate or a lower semiconductor layer 61, and by treating the surface of the resist film 62 with alkali solution. (FIG. 7(A)).

Figure 7A:
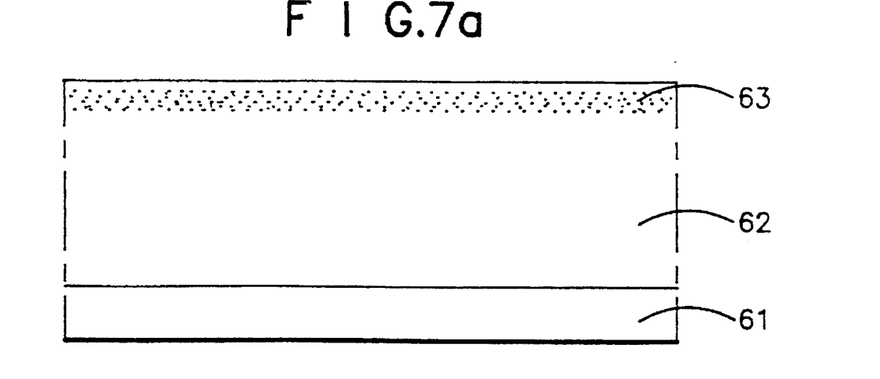
FIGS. 7(A) to 7(F) show a process for forming a submicron resist pattern in accordance with a first embodiment of this invention.

TMAH (Tetra methylammonium hydroxide) is used as the alkali solution for the surface treatment.

The resist film 62 is exposed using a mask 64 for exposure. (FIG. 7(B)).

Figure 7B:
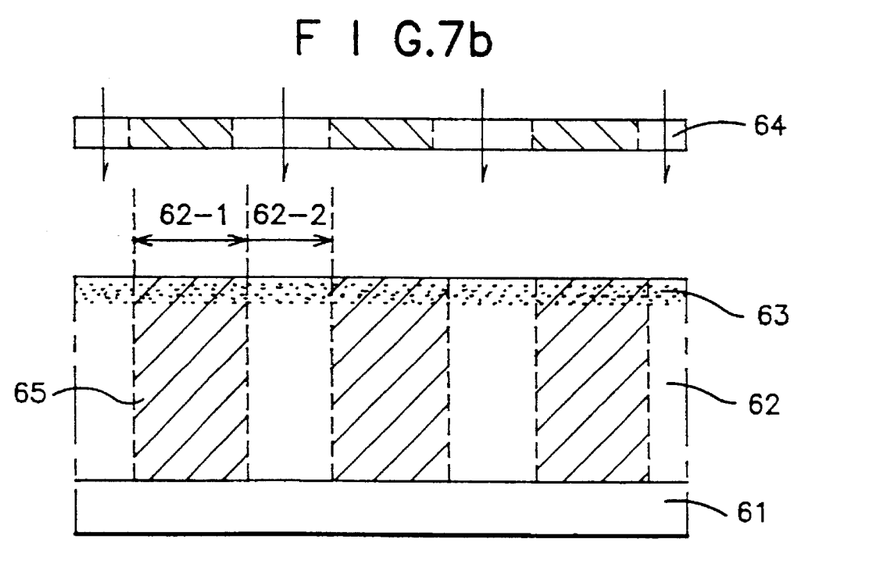

The resist film 62 is sensitive to ultra-violet rays, deep ultra-violet rays, electronic beams and X-rays.

In this time, a latent image pattern 65 is formed by an exposure to an optimum energy through the mask on the exposed parts 62-1.

Figure 7C:
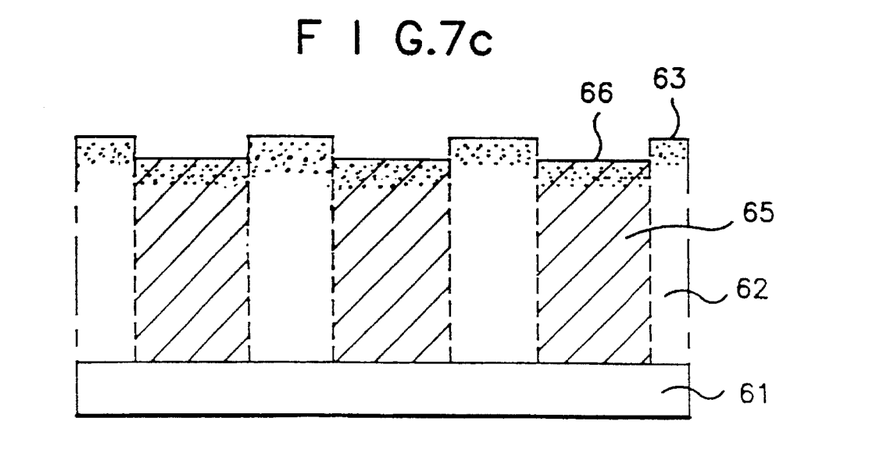

Then, a wet etching is carried out to etch the exposed resist film 62-1 as much as the thickness of the primary insoluble layer 63.

A secondary insoluble layer 66 is formed on the etched part due to the alkali solution used in the wet development. (FIG. 7(C)).

In this time, because overhangs develop on resist pattern when the exposed resist film 62-1 is developed more than ½ of the thickness of the total resist film 62, as a preventive measure against this, the etching is carried out to a minimum depth less than ½ of the thickness of the total resist film 62 providing a surface step with the non-exposed resist film 62-2.

After forming a step through exposure and development, a silylation process is carried out. (FIG. 7(D)).

Figure 7D:
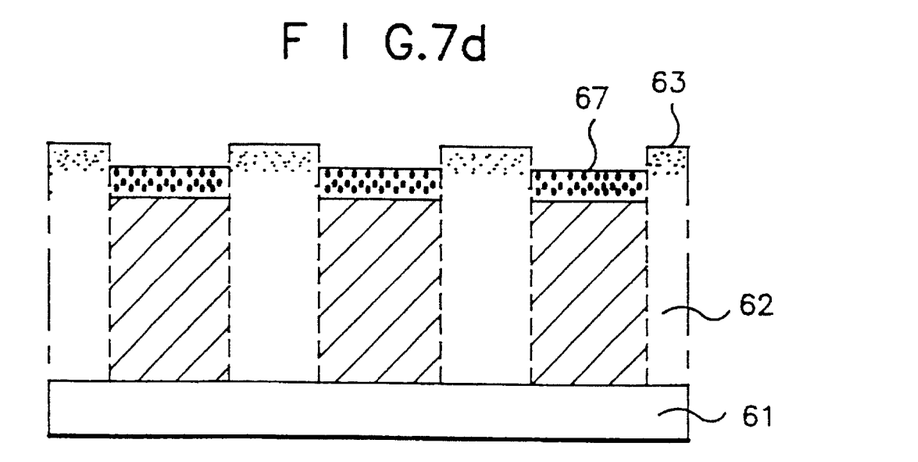

On heating in a HMDS atmosphere, silicon is diffused into the surface of the exposed resist film 62-1 to form a silylation layer 67 on the surface of exposed and etched resist film 62-1.

This silylation layer 67, a layer containing silicon, has resistance against O2 reactive ion etching serving as an etching mask layer on a following etching process of the non-exposed resist film 62-2.

The non-exposed resist film 62-2 is etched with O2 reactive ion etching method. (FIG. 7(E)).

Figure 7E:
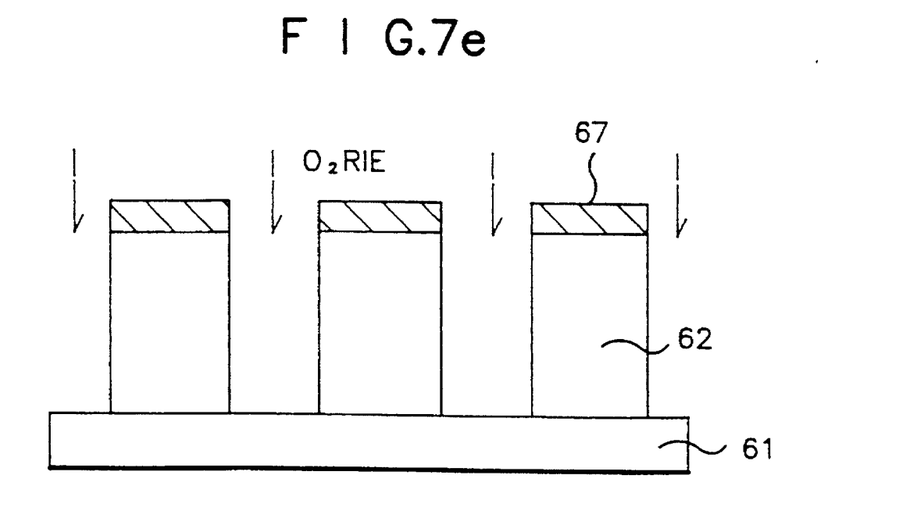

In this time, the silylation layer 67, a layer containing silicon, is converted into an oxide film on the dry development.

Finally, upon removal of the silylation layer 67 converted into an oxide film, a resist pattern 62' is obtained. (FIG. 7(F)).

Figure 7F:
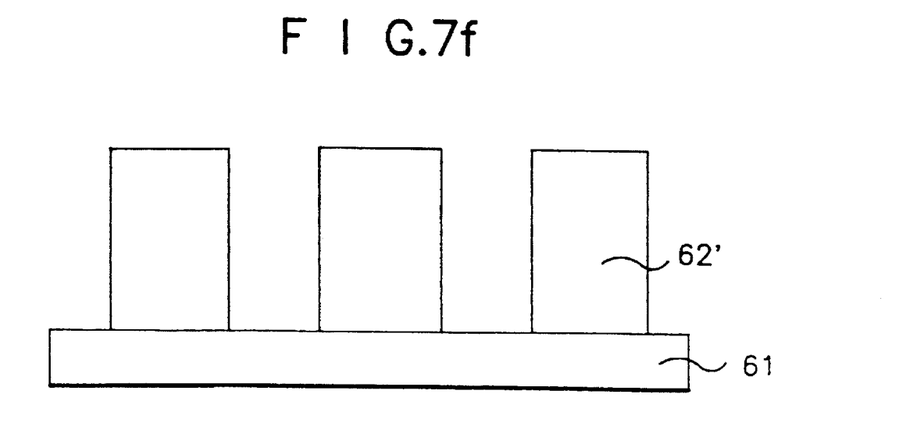
Figure 8:
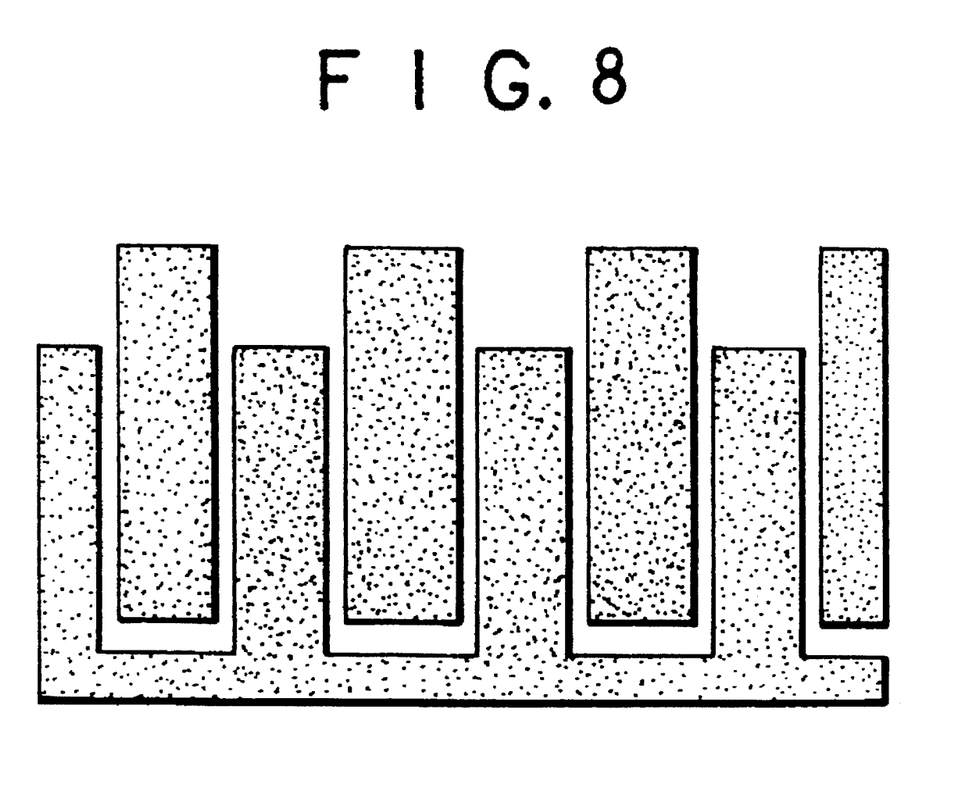
FIG. 8 is a scanning electron microscope photograph of FIG. 7(E).

As the obtained resist pattern 62' has been wet etched to a minimum, depth as much as the depth of the primary insoluble layer 63, developments of overhangs by the alkali surface treatment as well as the variations of the critical dimension according to the thickness of the silylated layer 67 can be prevented, whereby the obtained resist pattern 62' can have a vertical profile having steep slopes as shown in FIG. 8.

FIGS. 9(A) to 9(F) show a process for forming a submicron resist pattern in accordance with a second embodiment of this invention.

As shown in FIGS. 9, the second embodiment is identical with the first embodiment shown in FIGS. 7 with regard to the process, except a difference of a positive organic stepped resist film used in the first embodiment while a negative organic stepped resist film used in the second embodiment.

Figure 9A:
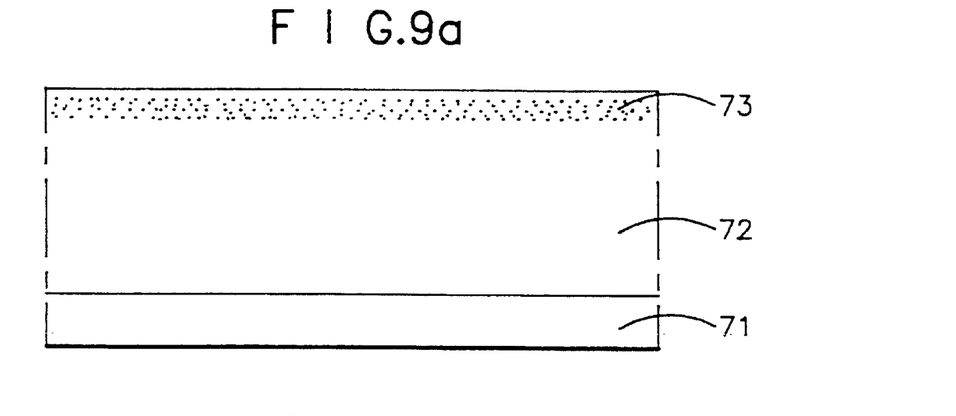
FIGS. 9(A) to 9(F) show a process for forming a submicron resist pattern in accordance with a second embodiment of this invention.
Figure 9B:
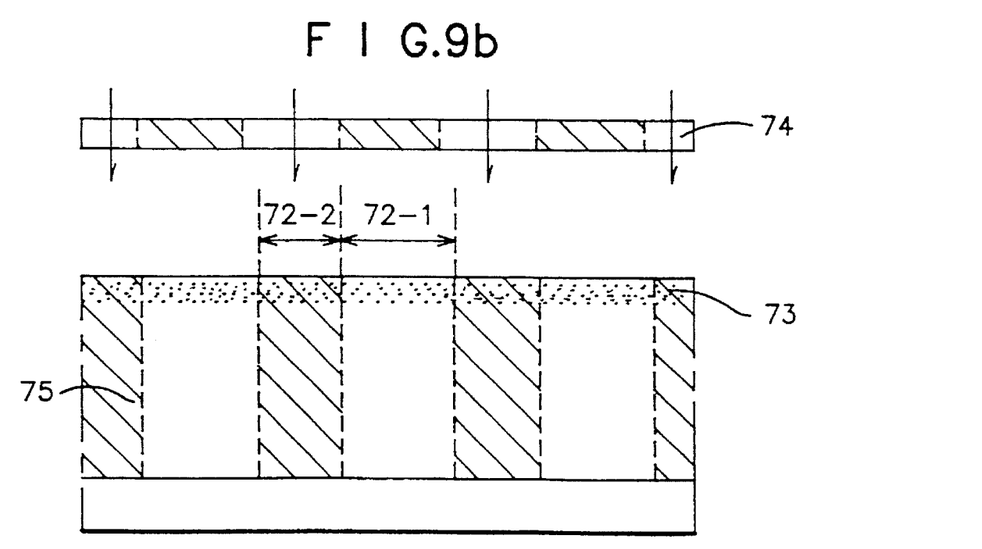

Accordingly, in the second embodiment, a latent image pattern 75 is formed on the non-exposed resist film 72-2 after the exposure (FIG. 9(B)), and the exposed resist film 72-1, a latent image pattern 75 has not been formed thereon, is a part to be removed in the following dry etching process.

Figure 9C:
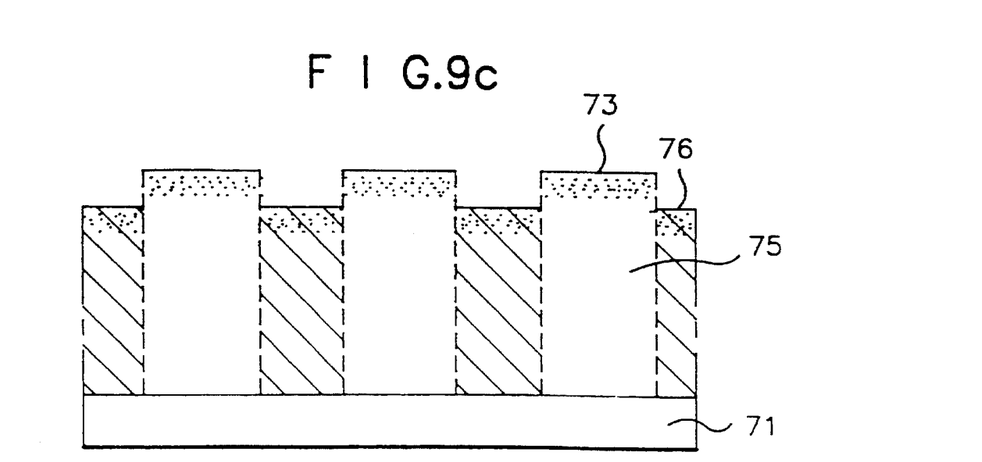
Figure 9D:
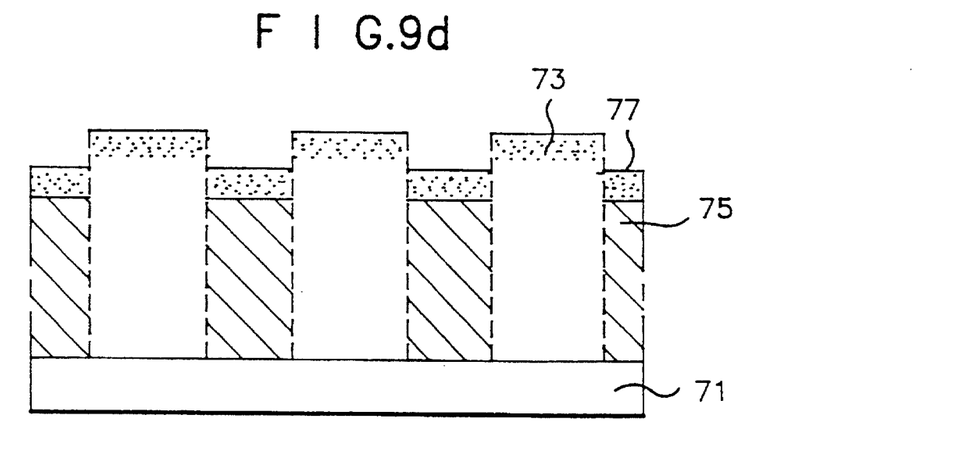

In the second embodiment, a secondary insoluble layer 76 is formed on the surface of the non-exposed resist film 72-2 in the developing process (FIG. 9(C)), and when a silylation process is carried out, a silylated layer 77 is formed on the surface of the non-exposed resist film 72-2 (FIG. 9(D)).

In this time, on etching of the non-exposed resist film 72-2, the etching depth of the non-exposed resist film 72-2 is to be less than ¼ of the total thickness of the resist film 72.

Figure 9E:
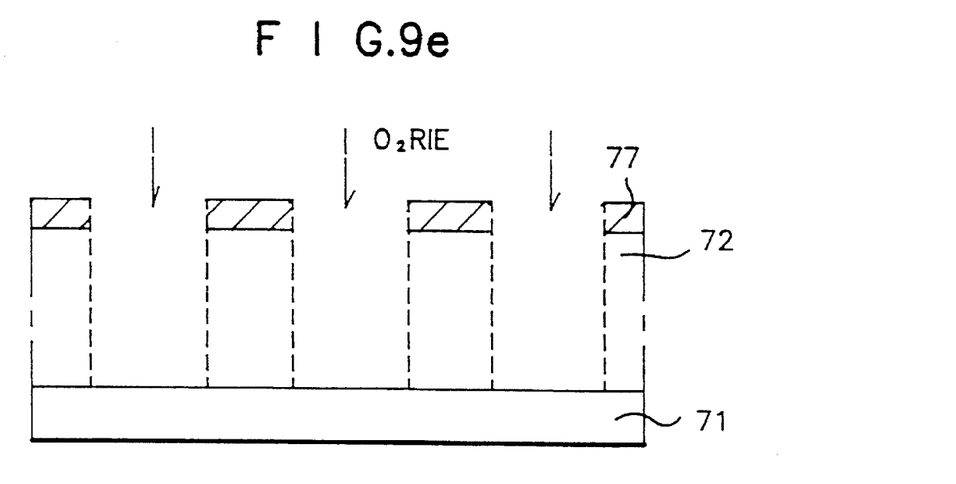
Figure 9F:
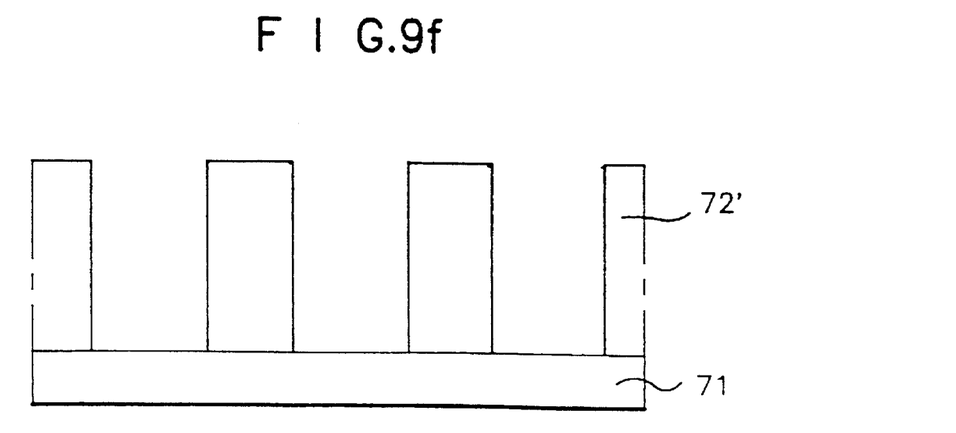

Therefore, the exposed resist film 72-1 is removed with an O2 reactive ion etching (FIG. 9(E)) to form a resist pattern 72' (FIG. 9(F)).

Figure 10:
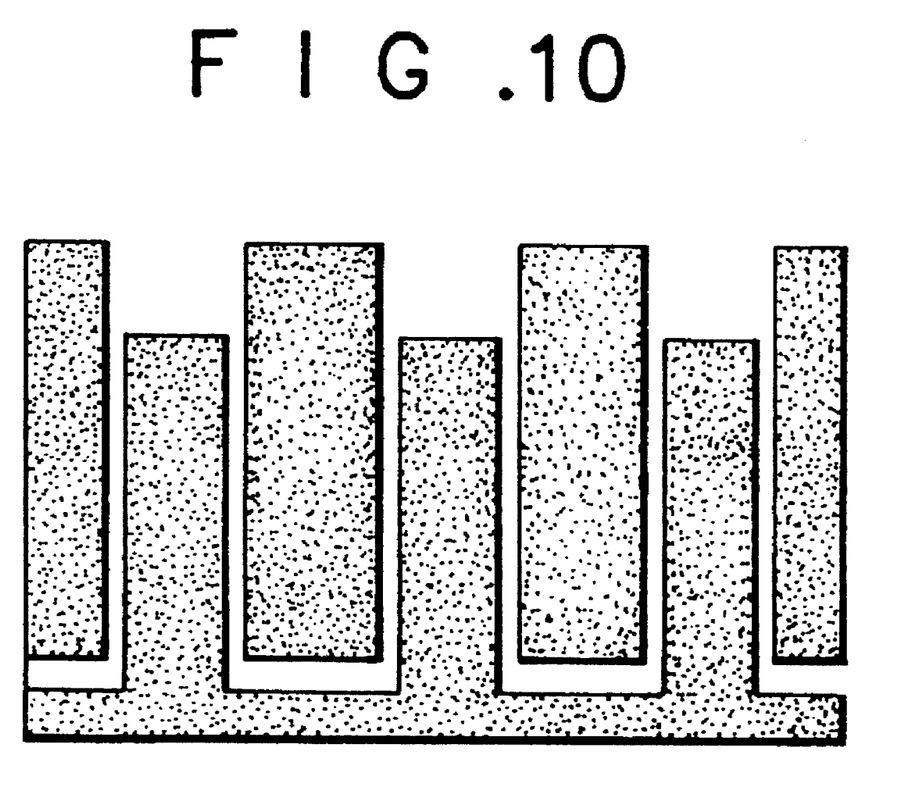
FIG. 10 is an SEM photograph of FIG. 9(E).

FIG. 10 is a SEM photograph of the resist pattern 72' in accordance with the second embodiment of this invention. With the second embodiment, a resist pattern 72' having profile with steep slopes can be obtained, too.

According to this invention as described above, by carrying out a silylation process after an alkali treatment, development in overhangs of a resist pattern can be prevented due to the alkali treatment, which permits an improvement of an etch profile as well as prevention of variation of a critical dimension depending on a silylation layer that allows to obtain high precision resist pattern. Accordingly, the resolution can be increased, etch critical dimension bias can be decreased because a resist profile having steep slopes can be obtained, and a standing wave effect of the resist pattern can be eliminated because most of the resist developments are proceeded in dry development.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a submicron resist pattern, comprising the steps of:
    (a) coating a photo resist film on a substrate;
    (b) forming a primary insoluble layer by a surface treatment of the resist film with an alkali solution;
    (c) forming a latent image pattern on an exposed part of the resist film by exposing the resist film using a mask;
    (d) etching the latent image pattern to a depth which is less than the thickness of the resist film using the alkali solution, thereby forming a surface step on the resist film and forming a secondary insoluble layer on the latent image pattern;
    (e) forming a silylation layer on the latent image pattern by carrying out a silylation process;
    (f) removing the resist film using the silylation layer as a mask; and
    (g) removing the silylation layer.

2. The method as claimed in claim 1, wherein the resist film is sensitive to ultra-violet rays, deep ultra-violet rays, electronic beams and x-rays.

3. The method as claimed in claim 2, wherein the resist film is an organic resist film.

4. The method as claimed in claim 1, wherein the resist film is a positive resist film.

5. The method as claimed in claim 1, wherein the alkali solution is tetra methylammonium hydroxide.

6. The method as claimed in claim 1, wherein the latent image pattern is etched to a minimum depth in order to provide surface steps which will not develop overhangs in an upper surface of the resist pattern.

7. The method as claimed in claim 6, wherein said latent image pattern etching step uses a wet etching process.

8. The method as claimed in claim 6, wherein the etching depth of the latent image pattern is the same as the depth of the primary insoluble layer.

9. The method as claimed in claim 8, wherein the etching depth of the latent image pattern is not more than one-half of the total thickness of the resist film.

10. The method as claimed in claim 1, wherein the silylation process includes surface treating the latent image pattern using hexamethyldisilazane.

11. The method as claimed in claim 1, wherein the resist film is etched using an $O_2$-reactive etching method.

12. The method as claimed in claim 11, wherein the silylation layer contains silicon.

13. The method as claimed in claim 12, wherein the silylation layer is converted into an oxide film while removing the resist film using the silylation layer as a mask.

14. The method as claimed in claim 13, wherein the silylation layer has a resistance against the $O_2$-reactive ion etching method.

15. The method as claimed in claim 1, wherein an etching depth of the resist film is not more than one-fourth of the total thickness of the resist film.

16. The method as claimed in claim 1, wherein step (g) is after (f), (f) is after (e), (e) is after (d), (d) is after (c), (c) is after (b), and (b) is after (a).

* * * * *